(12) United States Patent
Small et al.

(10) Patent No.: US 7,368,388 B2
(45) Date of Patent: May 6, 2008

(54) CERIUM OXIDE ABRASIVES FOR CHEMICAL MECHANICAL POLISHING

(76) Inventors: Robert J. Small, 5198 S. Civana Blvd., Tucson, AZ (US) 85747; Christopher G Hayden, 104 E. Nelson Ave., Alexandria, VA (US) 22301

(*) Notice: Subject to any disclaimer, the term of this patent is extended or adjusted under 35 U.S.C. 154(b) by 0 days.

(21) Appl. No.: 11/106,490

(22) Filed: Apr. 15, 2005

(65) Prior Publication Data

US 2006/0234509 A1    Oct. 19, 2006

(51) Int. Cl.
*H01L 21/302* (2006.01)
(52) U.S. Cl. .................. 438/692; 438/691; 438/693; 252/79.1
(58) Field of Classification Search ........... 438/691, 438/692, 693; 252/79.1, 79.2
See application file for complete search history.

(56) References Cited

U.S. PATENT DOCUMENTS

| 2003/0182868 A1* | 10/2003 | Nojo et al. ............ 51/307 |
| 2005/0090109 A1* | 4/2005 | Carter et al. ............ 438/692 |
| 2006/0032150 A1* | 2/2006 | So et al. ............ 51/309 |

* cited by examiner

*Primary Examiner*—Lan Vinh
(74) *Attorney, Agent, or Firm*—Hayden Stone PLLC; Christopher G. Hayden

(57) ABSTRACT

The use of mixed cerium-containing synthetic solid abrasive materials in chemical mechanical polishing slurries can provide better selectivity, better substrate removal rates, or lower defect rates than conventional ceria slurries. The slurries have abrasive particles that include a plurality of solid cerium-containing phases selected from $CeO_2$, $Ce_2O_3$, cerium-nitride material, cerium-fluoride material, and cerium-sulfide material, where different cerium-containing materials are present in different particles or on the same particles.

20 Claims, No Drawings

CERIUM OXIDE ABRASIVES FOR CHEMICAL MECHANICAL POLISHING

RELATED APPLICATIONS

Not Applicable.

STATEMENT REGARDING FEDERALLY SPONSORED RESEARCH OR DEVELOPMENT

Not Applicable.

FIELD OF THE INVENTION

The present invention relates to chemical mechanical polishing slurries for semiconductor integrated circuit substrates. Specifically, this invention is a CMP slurry having a unique chemistry that is especially suitable for chemical mechanical planarization where a high silicon dioxide removal rate, and a low silicon nitride removal rate are required on the same substrate.

DESCRIPTION OF THE RELATED ART

Integrated circuits (IC) are made up of millions of active devices formed in or on a silicon substrate. These devices are then connected by the use of multilevel metallized interconnects and vias. Interconnection structures normally have a first layer metallization, an interconnect plug, a second layer of metallization, and sometimes a third or more layers of metallization with their respective interconnects. Inter level dielectrics are used to electrically isolate the different levels of interconnections.

Shallow trench isolation (STI) is a technology for device isolation in a give layer in the IC manufacturing process. In a STI process, silicon nitride is deposited on thermally grown oxide. After deposition of the nitride, a shallow trench is etched into the substrate using a mask. A layer of oxide or nitride is then deposited into the trench so that the trench forms an area of insulated dielectric which acts to isolate the devices in a chip. The silicon nitride is applied to the silicon to prevent polishing of the masked silicon oxide of the device. The excess deposited oxide/nitride must be polished of and the trench planarized to prepare for the next level of metallization. The surface may then have one or two preparatory barrier layers applied thereon, followed by a larger layer of metal. This metal is then planarized. As is known in the art, many substrates inclusing dielectrics and certain metals (especially noble metals) are advantageously polished with a ceria abrasive.

In a typical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as "a CMP slurry", is flowed onto the pad during polishing. The chemicals and abrasive particles in the slurry initiate the polishing process by interacting with the wafer being polished. The polishing process is facilitated by the rotational movement of the pad relative to the substrate as slurry is provided to the wafer/pad interface. Polishing is continued in this manner until the final desired film thickness is achieved by removal of the required amount of thin-film material.

When polishing oxides, it is desirable of the slurry used to have a high removal rate towards the oxide layer and a low removal rate towards other layers which may be exposed during CMP, such as silicon nitride. The polishing slurry should be tailored to provide effective polishing at the desired polishing ranges selective to specific thin layer materials, while minimizing, at the same time, surface imperfections, defect, corrosion, erosion and the removal of silicon nitride and other stop layers.

CMP slurries useful for polishing oxides typically contain an abrasive, usually ceria, at an alkaline or high pH. These slurries either rely on potassium hydroxide or ammonium hydroxide to effectively buffer the high pH. While these slurries polish silica at high rates they also polish silicon nitride at high rates. See for example U.S. Pat. No. 6,491,843, the disclosure of which is incorporated by reference, which describes a slurry useful for STI containing 1% to 5% ceria providing high $SiO_2$ to SiN removal selectivity. See also U.S. Pat. No. 6,171,180, the disclosure of which is incorporated by reference, which describes a CMP process with ceria not entrained in the liquid but rather attached to the polishing pad.

The problem with ceria is that manufacturing methods have lagged behind that of alumina and silica, such that ceria particles tended to be larger and more irregularly shaped than the smaller, more controlled manufacture of for example alumina and silica, and also have more impurities. Unlike for example colloidal silica, ceria powder is generally extracted from an ore containing many impurities and then purified and pulverized, so that the characteristics vary according to the mine of the ore and the method of processing the particles. This problem was addressed by for example U.S. Pat. No. 5,772,780, the disclosure of which is incorporated by reference, which describes a slurry containing ceria with ceria particle size for example of less than about 30 nm and a metal contamination of less than about 10 ppm. The problem of varying activity due to natural variations in the mined ceria used to make polishing abrasive was solved by for example U.S. Pat. No. 5,891,205, the disclosure of which is incorporated by reference, which describes a slurry containing a generally uniformly-shaped nanocrystalline fumed ceria with ceria particle size for example of less than about 15 nm. Japanese Unexamined Patent Publication (Kohyo) No. 8-501768 discloses that sub-micron cerium oxide particles are obtained through a process comprising two steps: (a) forming an aqueous solution comprising a water-soluble trivalent cerium salt and an oxidizing agent and (b) aging the solution for four hours or longer, the solution being maintained in a liquid state. U.S. Pat. No. 6,615,499, the disclosure of which is incorporated by reference, describes a method of manufacturing ceria by rapidly heating a cerium salt to a calcining temperature of said salt at a temperature rise rate of 20 to 200 C./min, and thereafter calcining the cerium salt to produce cerium oxide. This patent noted that slow heating created a ceria that was more prone to scratch substrates than was ceria made by the fast heating method. Similarly, U.S. Pat. No. 6,221,118, the disclosure of which is incorporated by reference, describes a method of manufacturing ceria by heating a cerium carbonate salt to a calcining temperature. However, te ceria formed by such methods has a large particle size and must be milled, unlike the fumed ceria of U.S. Pat. No. 5,891,205. U.S. Pat. No. 5,938,837, the disclosure of which is incorporated by reference, describes a method of manufacturing ultrafine ceria which consist essentially of cerium oxide single crystal grains having a particle size ranging from 10 to 80 nm, comprising the steps of mixing an aqueous solution of cerous nitrate with a base at pH from 5 to 10, then rapidly heating the resulting mixture up to a temperature of 70 to 100 C., and maturing the mixture.

One problem with very small abrasives is that very low polishing rates are the normal result. Polishing with relatively large, rough-edged ceria particles provides a fast polish, that is, a high polishing rate, but results in scratches on the surface being polished. On the other hand, polishing with relatively small ceria particles reduces the scratching problem but also reduces the polish rate to such an extent that polishing with these small particles is impractical. In some cases of polishing with small ceria particles the polishing process is observed to "shut down", that is, to stop polishing. This problem was addressed by for example U.S. Pat. No. 6,358,853, the disclosure of which is incorporated by reference, which describes a slurry containing a bi-modal size distribution of ceria particles. Japanese Unexamined Patent Publication (kokai) No. 9-82667 discloses an abrasive composition comprising a plurality of cerium oxide particle grains having average crystallite sizes that differ from one another.

Treatments to reduce the defects and/or enhance selectivity are known. For example, the modification of ceria-based slurries for CMP operations using anionic polymers is reported by H. Nojo, M. Kodera, and R. Nakata, "Slurry Engineering For Self-stopping, Dishing Free SiO2-CMP," IEDM, pp. 349-353 (1996), where polyacrylic acid or ammonium poly acrylate is used to obtain self-limiting polishing. U.S. Pat. No. 6,443,811, the disclosure of which is incorporated by reference, describes a ceria slurry where the addition of surfactants and/or a non-ionic such as polyacrylamide or polyvinyl alcohol having a molecular weight of less than 10000 is effective to reduce defects. U.S. Pat. No. 5,876,490, the disclosure of which is incorporated by reference, discloses a slurry composition comprising abrasive particles and a polyelectrolyte wherein the charge on the polyelectrolyte is different from the charge on the abrasive particles. U.S. Pat. No. 6,540,935, the disclosure of which is incorporated by reference, describes a ceria slurry having poly-vinyl sulfonic acid and potassium hydrogen phthalate, each a passivator. U.S. Pat. No. 6,616,514, the disclosure of which is incorporated by reference, teaches a slurry having ceria and one of mannitol, sorbitol, mannose, xylitol, sorbose, sucrose, and dextrin, but notes that increased selectivity is accompanied by slower polishing rates. U.S. Pat. No. 6,514,821, the disclosure of which is incorporated by reference, teaches a slurry having ceria and a polycarboxylate. Such additives tend to reduce polishing rates.

Therefore, the trend toward smaller particle size reduces polishing rates, and the trend toward organic selectivity enhancers and such tend to further reduce polishing rates. Treatments to affect the activity of ceria abrasives is known but are generally not very effective. The aforementioned U.S. Pat. No. 6,443,811 describes minor polishing increases when for example proline, glycine, or alanine is added to the slurry. On the other hand, U.S. Pat. No. 6,478,836, the disclosure of which is incorporated by reference, describes increasing the rate of polishing of a ceria slurry by reducing the amount of all ionic species present in the slurry. U.S. Pat. No. 6,561,876, the disclosure of which is incorporated by reference, describes increasing the rate of polishing of a ceria slurry by the weak adsorption of a surfactant such as ammonium polyacrylate or an organic amine salt to an abrasive grain, that the surfactant can be easily desorbed from the abrasive grain on the occasion of polishing.

The use of mixed abrasives is known. For example U.S. Pat. No. 5,989,301, the disclosure of which is incorporated by reference, which describes an optical polishing slurry having alumina and ceria particles therein. Additionally, the aforementioned U.S. Pat. No. 5,891,205 disclosed the generally uniformly-shaped nanocrystalline fumed ceria with ceria particle size for example of less than about 15 nm in a slurry with silica particles or in a slurry with alumina particles. U.S. Pat. No. 5,264,010, the disclosure of which is incorporated by reference, discloses a slurry composition comprising a mixture of fused silica, precipitated silica and ceria. U.S. Pat. No. 6,559,056, the disclosure of which is incorporated by reference, discloses slurry having ceria and also having organic particles composed of a resin having anionic group such as carboxyl group into the molecular chains. Japanese Patent No. 2592401 discloses polishing of an insulating film with abrasive grains comprising, in predetermined amounts, cerium oxide "OPALINE" having a particle size of 300-500 nm, fumed silica, and precipitated silica, to thereby provide excellent surface flatness.

The use of a few selected mixed phase abrasives is known. For example, U.S. Pat. No. 5,891,205, the disclosure of which is incorporated by reference, describes an abrasive particle formed of between 0.5 and about 15% by weight ceria and alumina. U.S. Pat. No. 6,602,439, the disclosure of which is incorporated by reference, describes coated abrasive particles, wherein said coated abrasive particles comprise a $CeO_2$ coating. This patent also describes composite abrasive particles comprising a first abrasive compound selected from the group consisting of $Al_2O_3$ and $SiO_2$ and said second phase is $CeO_2$.

The use of mixed oxides is believed to be known. For example, it is believed that U.S. Pat. No. 6,177,026, the disclosure of which is incorporated by reference, teaches a solid catalyst that is a mixture of $TiO_2$ and $Ti_2O_3$. and this mixture may be in a single crystalline particle. The disclosure is not clear, however, and the particles may be either $TiO_2$ or $Ti_2O_3$.

The activity of fluorine present as a contaminant in ceria has been proposed as a polishing accelerator, that is, the cerium-based abrasives have not only a mechanical polishing function but also a chemical polishing function such that the fluorine component contained in the cerium-based abrasives reacts with the glass surface and forms a fluoride, which promotes the attack on the glass surface, as is described in U.S. Pat. No. 6,585,787, the disclosure of which is incorporated by reference. Similarly, in U.S. Pat. No. 6,602,439, the disclosure of which is incorporated by reference, the polishing activity of ceria is proposed to be due to the following reaction under slurry conditions: $2CeO_2 + 2e => Ce_2O_3 + O^{2-}$. This patent proposes that ceria can accelerate the removal of silica by chemically reacting with the silica surface. Finally, co-pending application Ser. No. 10/074,757 titled "Catalytic Composition for Chemical-Mechanical Polishing, Method os Using Same, And Substance Treated With Same filed Feb. 11, 2002 and having a common inventor, the disclosure of which is incorporated by reference, describes a method of forming absorbed metal coating on an abrasive, for example ceria, where the metal coating interacts with specific oxidizing agents to for superoxidizers, thereby greatly increasing polishing rates.

An industry moves toward smaller particles, to reduce defects and scratching, and toward the use of organic polishing selectivity aids, the polishing rates are becoming smaller. Methods of increasing the polishing rate, while maintaining selectivity of the ceria, is needed.

SUMMARY OF THE INVENTION

The use of mixed cerium-containing synthetic solid abrasive materials in chemical mechanical polishing slurries can provide better selectivity, better substrate removal rates, or lower defect rates than conventional ceria slurries. The slurries have abrasive particles that include a plurality of solid cerium-containing phases selected from $CeO_2$, $Ce_2O_3$, cerium-nitride material, cerium-fluoride material, and cerium-sulfide material, where different cerium-(O, N, S, or F)-containing solid materials are present in different particles or on the same particles.

The invention comprises a method of chemically mechanically polishing a substrate, for example a semiconductor substrate, a memory disk, or the like, which coomprise a metal, metal compound, and/or dielectric material, comprising the steps of:

A) providing a polishing slurry comprising:

a synthetic abrasive material comprising any of 1) particles comprising $CeO_2$ and particles comprising $Ce_2O_3$,
2) particles comprising $CeO_2$ and particles comprising ceric nitride,
3) particles comprising $CeO_2$ and particles comprising ceric fluoride,
4) particles comprising $CeO_2$ and particles comprising ceric sulfide,
5) particles comprising ceric fluoride and particles comprising $Ce_2O_3$,
6) particles comprising ceric nitride and particles comprising $Ce_2O_3$,
7) particles comprising ceric sulfide and particles comprising $Ce_2O_3$,
8) particles comprising both $CeO_2$ and $Ce_2O_3$ phases,
9) particles comprising both $CeO_2$ and ceric nitride phases,
10) particles comprising both $CeO_2$ and ceric fluoride phases,
11) particles comprising both $CeO_2$ and ceric sulfide phases, or
12) particles comprising a plurality of Ce (metal), $CeO_2$, $Ce_2O_3$, ceric nitride, ceric fluoride, and ceric sulfide phases, or any combination of the above, and a solvent comprising water, a polar organic solvent, a non-polar organic solvent, or mixture thereof, and optionally a polishing accelerator and/or selectivity enhancer, B) providing a substrate having a surface comprising a dielectric material; and C) movably contacting the polishing slurry with the surface under conditions where a portion of the substrate is removed by a chemical mechanical polishing process. In preferred embodiments of the invention, the non-$CeO_2$ phase is concentrated at the surface of a particle. Mixed phases within the body of the particles will weaken the particle unnecessarily, and do not contribute significantly to the added activity of the slurry. It is known how to form mixed phase particulates. In one embodiment, the particulates are non-stoichiometric. Certain metal oxides are known to be thermodynamically stable in a nonstoichiometric form which also have found practical applications in the arts. For example, zinc oxide, in a non-stoichiometric state including an of excess of zinc and a deficiency of oxygen, is known in the art as a luminescent material which has found use in displays. Manufacture of non-stoichiometric submicron metal oxide particles is disclosed in U.S. Pat. No. 5,750,188, the disclosure of which is incorporated herein by reference thereto. In a typical process for forming a luminescent layer of zinc oxide, non-luminescent zinc oxide powder is first activated by annealing, thereby transforming it into a luminescent form. The annealing of the powder is performed at temperatures in excess of 800 degrees Celsius. The annealing step generates the intrinsic solid state defects which are responsible for the efficient luminescence of the characteristic blue-green light upon excitation by ultraviolet or electron irradiation. The zinc oxide retains its powdery state subsequent the annealing step. Such a process, including reducing the cerium oxide with a combination of heat and a absence of air (and advantageously in the presence of an oxygen scavenger such as carbon monoxide) can form particles of this invention.

When the abrasive particle comprises two or more of $CeO_2$, $Ce_2O_3$, ceric nitride, ceric fluoride, and ceric sulfide materials, it is preferred that at least two of the aforementioned materials are present each in an amount each greater than about 0.001%, preferably greater than about 0.01%, for example at least 1%, by weight of the particle. In preferred embodiments, the particles comprise more than 99% $CeO_2$, with less than 1%, typically between 0.001% and 0.1% of the other phase. As used herein, unless otherwise specified, the term % means weight percent.

When the slurry has different abrasive particles, beneficially first abrasive particles comprise one of $CeO_2$, $Ce_2O_3$, ceric nitride, ceric fluoride, or ceric sulfide in an amount greater than about 0.1%, preferably greater than about 1%, for example at least 10%, by weight of the first abrasive particle, and a second abrasive particle that comprises one of the aforesaid materials different than that of the first particle and also beneficially in an amount each greater than about 0.1%, preferably greater than about 1%, for example at least 10%, by weight of the second abrasive particle, it is preferred that the first and second abrasive particles are present in a slurry in a weight ratio between about 1000:1 and 1:1000, for example 100:1 to 1:100, including embodiments where the weight ratio is between 1:10 and 10:1, are present in an amount each greater than about 0.01%, preferably greater than about 0.1%, for example at least 1%, by weight of the particle.

In a first embodiment of the invention, abrasive particles comprising mixed cerium oxidation states are used in a CMP process to polish a substrate. One embodiment of the invention encompasses methods of chemically mechanically polishing substrates using a cerium oxide-based abrasive, wherein the cerium oxide abrasive particles comprise between about 0.01% to about 99.999%, for example between about 1% to 99.9%, of a $CeO_2$ phase, and between about 0.001% to about 99.99%, for example between about 0.01% to 20% of a $Ce_2O_3$ phase, by weight of the total cerium oxides. Another embodiment of the invention encompasses methods of chemically mechanically polishing substrates using a cerium oxide-based abrasive, wherein the cerium oxide abrasive particles comprise a main amount of a $CeO_2$ phase and a minor amount, e.g., between about 0.001% to about 50%, for example between about 0.01% to 10% by weight of the total cerium oxides, of a $Ce_2O_3$ phase. Advantageously, in this embodiment, at least a portion of the $Ce_2O_3$ phase exists on the surface of the particle.

In a second embodiment of the invention, abrasive particles comprising cerium oxide abrasive are used in a CMP process to polish a substrate. The cerium oxide is the product of a process whereby $CeO_2$ particles are treated to form at least some of a $Ce_2O_3$ phase, e.g., between about 0.001% to about 50%, for example between about 0.001% to 10% by weight of the total cerium oxides, and then the particles are placed in an oxidizing environment whereby at least a portion of the $Ce_2O_3$ phase is converted back to a $CeO_2$ phase. The cycle weakens the crystal structure, often leaving a disturbed crystalline structure which facilitates conversion of the $CeO_2$ phase to the $Ce_2O_3$ phase during polishing.

In a third embodiment of the invention, abrasive particles comprising cerium oxide abrasive are used in a CMP process to polish a substrate. The cerium oxide is the product of a process whereby $Ce_2O_3$ particles are placed in an oxidizing environment whereby at least a portion, e.g., between about 0.001% to about 99.9%, for example between about 1% to 50%, by weight of the total cerium oxides, of the $Ce_2O_3$ phase is converted to a $CeO_2$ phase.

In a fourth embodiment of the invention, abrasive particles comprising as a primary constituent $CeO_2$ and abrasive particles comprising as a primary constituent $Ce_2O_3$ are used in a CMP process to polish a substrate. The ratio by weight of the abrasive particles comprising as a primary constituent $CeO_2$ and abrasive particles comprising as a primary constituent $Ce_2O_3$ can range from about 1:40 to about 40:1, but preferably the ratio is between about 1:40 to about 1:1. The size ratio of the abrasive particles comprising as a primary constituent $CeO_2$ and abrasive particles comprising as a primary constituent $Ce_2O_3$ can range from about 1:4 to about 40:1, but preferably the ratio is between about 1:2 to about 3:1. In another embodiment the abrasive particles comprising as a primary constituent $Ce_2O_3$ can comprise between about 0.1 and about 49%, for example 5 to 30%, of $CeO_2$ based on the total weight of the cerium oxides.

Typically the ceria particle is solid ceria, for example precipitated ceria, colloidal ceria, ceria calcined from cerium salts, natural ceria, or fumed ceria. The ceria can be made by any process known in the art, including those processes disclosed in the Description of Related Art. In one embodiment of this invention, the ceria is coated onto a metal oxide abrasive, for example onto a alumina particle or onto a silica particle. In another embodiment of this invention, the ceria phase is admixed with a metal oxide phase, for example with alumina or with silica, to form a composite particle. The invention also encompasses any of the above which have been further treated by for example washing, milling, or coating, and/or a mixture of any of the above, and/or a mixture of any of the above with non-ceria abrasives.

In an alternate embodiment, the $Ce_2O_3$ particle or phase in any of the above embodiments can be partially replaced with cerium nitride or ceric nitride, ceric sulfide, or mixed forms of cerium solids comprising N, S, F, or any combination thereof, but not for example soluble cerium materials such as cerium sulfate.

In an alternate embodiment, the $Ce_2O_3$ particle or phase in any of the above embodiments can be partially replaced with a cerium-fluorine-containing solid, for example CeOF, $Ce_2O_2F_2$, $CeF_4$, and/or $CeF_3$. In another an alternate embodiment, the $Ce_2O_3$ particle or phase in any of the above embodiments can be completely replaced with $CeF_3$. The fluoride salts would accelerate the $SiO_2$ polishing rate, yet the SiN rate will not be very high. For example, the fluoride salt abrasive particles, or the ceria particles containing cerium fluoride, or the can improve polishing rates, though for some substrates with less selectivity, especially when the polishing slurry is slightly acid or neutral, e.g., pH between about 3 and about 11, for example between about 4.5 and about 8.5.

In an alternate embodiment, the $Ce_2O_3$ particle or phase in any of the above embodiments can be partially replaced with either $CeOF_2$ or $CeF_4$. In another an alternate embodiment, the $Ce_2O_3$ particle or phase in any of the above embodiments can be completely replaced with either $CeOF_2$ or $CeF_4$. The fluoride salts would accelerate the $SiO_2$ polishing rate, yet the SiN rate will not be very high. For example, the fluoride salt abrasive particles, or the ceria particles containing cerium fluoride, or the can improve polishing rates, though for some substrates with less selectivity, especially when the polishing slurry is slightly acid or neutral, e.g., pH between about 3 and about 11, for example between about 4.5 and about 8.5.

In an alternate embodiment, the $Ce_2O_3$ particle or phase in any of the above embodiments can be partially replaced with a cerium-nitride-containing solid, for example CeON, $Ce_2O_2N$, $Ce_2N_2O$, and/or $CeN_2$. In another an alternate embodiment, the $Ce_2O_3$ particle or phase in any of the above embodiments can be completely replaced with a cerium nitride material. The nitride salts would disrupt the ceria crystal and therefore increase its activity and resiliency. For example, the nitride salt abrasive particles, or the ceria particles containing cerium nitride, can improve polishing rates with little loss of selectivity.

In an alternate embodiment, the $Ce_2O_3$ particle or phase in any of the above embodiments can be partially replaced with either $CeN_2$ or $Ce_2N_3$. In another an alternate embodiment, the $Ce_2O_3$ particle or phase in any of the above embodiments can be completely replaced with either $CeN_2$ or $Ce_2N_3$.

In an alternate embodiment, the $Ce_2O_3$ particle or phase in any of the above embodiments can be partially replaced with a cerium-nitride-containing solid, for example CeOS, $Ce_2O_2S$, $Ce_2S_2O$, and/or $CeS_2$. In another an alternate embodiment, the $Ce_2O_3$ particle or phase in any of the above embodiments can be completely replaced with a cerium sulfide material. The sulfide salts would disrupt the ceria crystal and therefore increase its activity and resiliency. For example, the cerium sulfide abrasive particles, or the ceria particles containing cerium nsulfide, can improve polishing rates with little loss of selectivity.

In an alternate embodiment, the $Ce_2O_3$ particle or phase in any of the above embodiments can be partially replaced with either $CeS_2$ or $Ce_2S_3$. In another an alternate embodiment, the $Ce_2O_3$ particle or phase in any of the above embodiments can be completely replaced with either $CeS_2$ or $Ce_2S_3$.

In an alternate embodiment, the $Ce_2O_3$ particle or phase in any of the above embodiments can be partially replaced with $CeO(OH)_2$. In another alternate embodiment, the $Ce_2O_3$ particle or phase in any of the above embodiments can be completely replaced with $CeO(OH)_2$.

Alternately, the cerium-containing particles of any embodiment described above can be used together with the cerium-containing particles of any other embodiment described above to chemically mechanically polish a substrate.

For example, a slurry may comprise A) particles of mixed $CeO_2/Ce_2O_3$ treated to provide between 0.01% and 30% by weight of the particles of a $Ce_2O_3$ phase based on the weight of cerium oxides in the particle, present in an amount of from 0.01% to 20% by weight, B) $CeF_2$ particles, present in an amount between 0.001% and 3% by weight, for example, and C) $CeO_2$ particles that had previously been treated to provide between 0.01% and 30% by weight of the particles of a $Ce_2O_3$ phase, and then substantially converted back to a $CeO_2$ phase, present in an amount of from 0.001% to 20% by weight, for example, can be admixed to form a slurry to chemically mechanically polish a substrate.

Another non-limiting example of mixing particles from various embodiments includes for example, particles of mixed $CeO_2/Ce_2O_3$ treated to provide between 0.1% and 30% by weight of the particles of a $Ce_2O_3$ phase based on the weight of cerium oxides in the particle, present in an amount of from 0.001% to 20% by weight, for example, can be used in a slurry having for example $CeO_2/CeF_3$ particles that provide between 0.001% and 30% by weight of the particles of a $CeF_3$ phase, present in an amount between 0.001% and 3% by weight, can be admixed to form a slurry to chemically mechanically polish a substrate.

In one preferred embodiment, abrasive particles used in this invention are produced when a mixed cerium oxides precipitate is formed. The process includes dissolving a $Ce^{+4}$ salt in an acid solution and then precipitating the oxide/hydroxide while controlling the atmosphere, that is, the amount of dissolved oxygen available. The degree of oxidation in one preferred embodiment is controlled in part by adding hydroxylamine to the solution, which functions both as a reducing agent and as a pH adjustment material. The hydroxylamine will decompose as it is used, and evolved nitrogen-containing gas will control atmospheric oxygen. Mixed salts can be obtained. Minor constituents, for example fluoride, can be incorporated into the solution. The precipitation process is discussed, for example, in J. Electrochemical Soc, 149(12) C623-C630 2002.

In a second preferred embodiment, abrasive particles used in this invention are produced by exposing $CeO_2$ particles to oxygen-poor conditions such that the $CeO_2$ releases oxygen. Without being bound by theory, it is believed that to maintain electrical balance, cerium ions in cerium oxide gain electrons, and a series of "reduced" compounds, with $Ce_2O_3$ as a meta-stable end product, form. The conditions under which these reactions occur are similar to those conditions in which catalytic converters operate—e.g., between about 1000° to about 2200° F., alternately between about 300° and 1000° C., for example between about 600° and 900° C. The converted $Ce_2O_3$ easily takes up oxygen under oxygen-rich conditions at the same temperature. This allows the manufacturer to start with either $Ce_2O_3$ or ceria particles, at least partially form the other phase, and if desired at least partially reconvert the other phase back into its original form. N. V. Skorodumova, S. I. Simak, B. I. Lundqvist, I. A. Abrikosov, and B. Johansson, in Physical Review Letters, 14 Oct. 2002, offer a detailed quantum-mechanical description of how this reaction occurs. They suggest that the transition from $CeO_2$ to $Ce_2O_3$ results from the formation of an oxygen vacancy, in which an oxygen atom leaves a spot it normally occupies on the cerium oxide crystal lattice. The oxygen has to leave behind two electrons—quantum effects make this process possible by allowing the electrons to "localize" on each of two nearby $Ce^{+4}$ ions to convert these to $Ce^{+3}$. The process disclosed in U.S. Pat. No. 5,750,188 is also incorporated herein by reference thereto.

Heating the ceria in an environment that is oxygen poor to a temperature advantageously between about 300° and 1000° C., and then adding at this elevated temperature a gas that contributes a fluoride, e.g., HF or gas species containing plurality of fluorine atoms such as tetrafluoroboric acid, $SF_6$, $CF_4$, and/or $CHF_3$, or mixtures thereof will result in incorporation of fluoride ions in the cerium oxide crystals.

Heating the ceria in an environment that is oxygen poor for a time sufficient to form a $Ce_2O_3$, and then adding at this elevated temperature a gas that contributes a fluoride, e.g., HF or gas species containing plurality of fluorine atoms such as tetrafluoroboric acid, $SF_6$, $CF_4$, and/or $CHF_3$, or mixtures thereof will result in more efficient incorporation of fluoride ions in the cerium oxide crystals.

Similarly, heating in an oxygen-poor environment and contacting with a nitrogen donor atmosphere or sulfur donating atmosphere will result in incorporation of cerium nitrides or sulfides into the crystal.

Of course, embodiments where the heating is rapid, e.g., from 20° to 200° C. per minute as disclosed in U.S. Pat. No. 6,615,499, is envisioned in this invention.

It can be seen that a partial conversion from one phase to another will result in stresses along the crystal boundaries. Without being bound by theory, it is believed that because full re-conversion of material that started as $CeO_2$ and was partially converted to $Ce_2O_3$ is very unlikely, particles that have undergone prior partial conversion from one phase to another will have an increased tendency to re-convert under the appropriate circumstances. This re-conversion when it occurs under polishing conditions not only forms the desired $Ce_2O_3$ but also liberates the oxygen radical.

Similarly, without being bound by theory, it is believed that disruptions in the crystal structure provided by changing the crystalline phase provides a more forgiving and/or reactive site.

While natural ceria can have some cerium fluoride therein, as postulated by U.S. Pat. No. 6,585,787, the uncontrolled quantity and location of the cerium fluoride in natural ore makes this particular material of little value in modern CMP slurries, which require the purtity found in fumed or precipitated or calcined cerias. These synthetic processes form substantially spherical and small, e.g., below 0.1 micron in diameter, particles. However, these particles do not have a controlled amount of cerium fluoride. Therefore, one embodiment of this invention includes adding a predetermined amount of calcium fluoride to synthetic, e.g., fumed, precipitated, colloidal, and/or calcined, $CeO_2$ particles or $Ce_2O_3$ particles or composite particles.

Fluoride can be incorporated into $CeO_2$ or $Ce_2O_3$ or composite thereof, to form a mixed phase material comprising cerium and fluorine atoms, by for example the same process whereby oxygen can be added or removed, that is, by heating the crystals to a temperature advantageously greater than about 300 C in an atmosphere that comprises fluorine or a fluoride-containing gas and maturing the material for a time sufficient to incorporate the desired amount of F.

Alternatively or additionally, $CeO_2$ or $Ce_2O_3$ or $CeF_2$ or $CeO(OH)_2$ and/or mixtures or composites thereof, before being placed in a slurry, can be exposed to for example focused highly energetic high fluence levels produced by 157 nm and 193 nm excimer lasers such as is used in optical lithography systems. The cerium will strongly absorb the VUV light with the VUV absorbing cerium then damaging and corrupting the crystal structure.

The mixed cerium oxide and/or fluoride phases can be formed using the fuming processes described in U.S. Pat. Nos. 5,261,930 or 5,128,081, the disclosures of which are incorporated by reference, where control of the gas phase during formation of fumed metal oxides can provide different oxide phases of for example titanium, zinc, magnesium, or aluminum. This process is useful for forming mixed phase cerium material by one of ordinary skill in the art without un-due experimentation, with the benefit of this disclosure, to form for example mixed phases of cerium oxides, cerium hydroxides, cerium fluorides, and/or combinations thereof.

U.S. Pat. No. 5,128,081 also describes used of particular oxidation treatments converting metal into various phases by heating in an atmosphere comprising for example halogens (e.g., fluorine compounds), nitriding atmospheres such as nitrogen and ammonia, or sulfiding atmospheres such as S or hydrogen sulfide. It is known to form cerium oxides in this manner, and controlling the atmosphere will provide material comprising both $CeO_2$ or $Ce_2O_3$. We have previously mentioned that the starting material can be ceria. The material can also be, for example, cerium salts, for example solid cerium carbonate, cerium nitrate, cerium sulfate, cerium ammonium nitrate, cerium oxalate, and the like.

Many of the treatments used to form mixed phase ceria involve high temperatures. Since the materials involved are submicrom particulates and gas, it may be possible to convert ceria to a mixed phase material while keeping the ceria suspended in the gases of choice. If such treatments result in sintering particles or such, the resulting material may advantageously be wet milled using a high speed mill and a zirconium silicate and/or zirconia (doped or undoped) of diameter between about 0.2 mm to 0.7 mm in diameter for a period less than one half hour to break up agreggates.

The CMP compositions useful in the CMP methods described here typically comprises an abrasive, though in some embodiments an abrasive pad is used, and the CMP composition can additionally comprise abrasives or alternatively be substantially free of abrasives. When the ceria-based abrasive, e.g., the particles comprising one or more of $CeO_2$ or $Ce_2O_3$ or $CeF_2$ or $CeO(OH)_2$ and/or mixtures or composites thereof, are incorporated into a slurry, the total amount is beneficially between about 0.01% to about 50% by weight, relative to the weight of the fluid portion of the slurry. The various particle embodiments can be mixed as desired to fall within that range.

For slurries comprising $CeO_2$—$Ce_2O_3$ composite particles, the amount is beneficially between about 0.01% to about 50% by weight, for example from about 1% to about 20% by weight, alternatively from about 3% to about 10% by weight, relative to the weight of the fluid portion of the slurry.

For slurries comprising $CeO_2$ and $Ce_2O_3$ particles, the amount is beneficially between about 0.01% to about 50% by weight, for example from about 1% to about 20% by weight, alternatively from about 3% to about 10% by weight, relative to the weight of the fluid portion of the slurry, and the weight ratio of $CeO_2$ to $Ce_2O_3$ can be from about 40:1 to about 1:40, beneficially from about 4:1 to about 1:4.

For slurries comprising particles comprising a solid material comprising cerium and fluorine, for example $CeOF_2$, $CeF_3$, $CeOF$ or $CeF_4$ phases, alone or as synthetic composite particles also having $CeO_2$ or $Ce_2O_3$, phases, or mixtures thereof, the amount is beneficially between about 0.001% to about 50% by weight, for example from about 0.01% to about 5% by weight, alternatively from about 0.1% to about 10% by weight, relative to the weight of the fluid portion of the slurry. The mixed phase may be formed by exposing ceria particles to HF gas at elevated temperature. Of course, the slurry can contain other cerium-containing abrasive particles, or other abrasives, as is known in the art, provided the amount of abrasive is below about 50% by weight of the fluid portion of the slurry.

For slurries comprising particles consisting essentially of $CeOF_2$, $CeF_3$, $CeOF$, $CeF_4$, or mixtures thereof, the amount of cerium-fluorine-containing particles is beneficially between about 0.01% to about 10% by weight, for example from about 0.1% to about 3% by weight, alternatively from about 1% to about 10% by weight, relative to the weight of the fluid portion of the slurry, and the weight ratio of $CeO_2$ to $CeF_3$ can be from about 200:1 to about 1:1, beneficially from about 20:1 to about 4:1.

For slurries comprising particles comprising a solid material comprising cerium and nitrogen as a nitride, for example $CeN_2$ or $Ce_2N_3$ phases, alone or as synthetic composite particles also having $CeO_2$ or $Ce_2O_3$, phases, or mixtures thereof, the amount is beneficially between about 0.01% to about 50% by weight, for example from about 1% to about 5% by weight, alternatively from about 0.1% to about 10% by weight, relative to the weight of the fluid portion of the slurry. The cerium nitride can alternately be a cerium oxynitride. The gas phase containing available nitrogen is as is known in the art—one such gas which may form an oxynitride phase at elevated temperature is cyanide gas, provided the process can be performed without endangering workers. Of course, the slurry can contain other cerium-containing abrasive particles, or other abrasives, as is known in the art, provided the amount of abrasive is below about 50% by weight of the fluid portion of the slurry.

For slurries comprising particles consisting essentially of CeON, $CeN_2$ or $Ce_2N_3$ $Ce_2NO_2$, or mixtures thereof, the amount of cerium-nitrogen-containing particles is beneficially between about 0.01% to about 10% by weight, for example from about 0.1% to about 3% by weight, alternatively from about 1% to about 10% by weight, relative to the weight of the fluid portion of the slurry, and the weight ratio of $CeO_2$ to $CeF_3$ can be from about 200:1 to about 1:1, beneficially from about 20:1 to about 4:1.

For slurries comprising particles comprising a solid material comprising cerium and sulfur as a sulfide, for example $CeS_2$ or $Ce_2S_3$ phases, alone or as synthetic composite particles also having $CeO_2$ or $Ce_2O_3$, phases, or mixtures thereof, the amount is beneficially between about 0.01% to about 50% by weight, for example from about 1% to about 5% by weight, alternatively from about 0.1% to about 10% by weight, relative to the weight of the fluid portion of the slurry. Of course, the slurry can contain other cerium-containing abrasive particles, or other abrasives, as is known in the art, provided the amount of abrasive is below about 50% by weight of the fluid portion of the slurry.

For slurries comprising particles consisting essentially of CeOS, $CeS_2$ or $Ce_2S_3Ce_2SO_2$, or mixtures thereof, the amount of cerium-sulfur-containing particles is beneficially between about 0.01% to about 10% by weight, for example from about 0.1% to about 3% by weight, alternatively from about 1% to about 10% by weight, relative to the weight of the fluid portion of the slurry, and the weight ratio of $CeO_2$ to $CeF_3$ can be from about 200:1 to about 1:1, beneficially from about 20:1 to about 4:1.

An abrasive particle comprising cerium in the chemical mechanical polishing methods described here are solid with a size between about 0.0005 microns and about 3 microns. In preferred preparations, the coated particles have an average particle size of less than about 0.2 microns (200 nm), preferably having an average particle size of about 0.1 microns or less, for example a composition where about 90% or more of the abrasive particles (by number) have a particle size less than about 30 nm. There is no particular minimum diameter. With very small, e.g., between about 0.001 micron and 0.01 micron particles are used, polishing rates are very slow, but finer patterns can be polished with fewer defects. Various embodiments use abrasive particles of average size 0.001 microns and 0.02 microns; alternatively 0.005 microns to 0.05 microns; alternatively 0.04 microns to 0.1 microns; alternatively 0.05 microns to 0.15 microns; alternatively 0.1 microns to 0.4 microns; alternatively 0.3 microns to 1 micron; alternatively 1 micron 3 microns; where different sizes are used for different substrates and with regard to the acceptable amount (depth) of scratches where scratches do not prevent further manufacture of the product, as is known in the art.

The surface area of the abrasives can vary widely, for example between about 1 and about 2000 square meters per gram, as measured by BET. Ceria BET tends to be low, for example from about 1 to about 150 square meters per gram, but particles with other phases such as alumina or silica can have higher BET values.

When abrasive size is mentioned, the size is the average particle diameter, which can be measured by for example microscopic examination, or by other techniques generally used in the industry. When size ranges are specified, for example, from about 10 to about 80 nanometers, this means that the average particle size falls within those extremes, but preferably the individual particles have a size distribution such that substantially all particles, e.g., at least about 95% by count (for a single mode composition) have sizes within about 30%, preferably within about 10%, of the average particle diameter. Of course, it is realized that formulations may and usually do contain a plurality of structures, be they monodispersed particles, cocoon shaped particles, cocoon-shaped particles formed of bound substantially spherical particles, chains, and aggregates. Additionally, the size distribution of the abrasives can be single modal, bi-modal, or polymodal. Of course, as the number of sizes increase, the control advantages of having a narrow size distribution decline. In most bi-modal embodiments, the two sizes differ from one-another by less than a factor of about three. However, polymodal size distributions exhibit excellent polishing characteristics and low defects if the smaller particle is less than 4 times, and even less than about 10 times, the size of the larger particles.

SUBSTRATE: The cerium-containing abrasives of this invention can be used to polish a substrate. The composition or slurry of this invention may be used to polish/clean at least one feature or layer on a substrate such as a semiconductor substrate or any other substrate associated with integrated circuits, a thin film transistor-liquid crystal display ("TFT-LCD"), a glass substrate, thin films, memory storage devices including memory disks, optical instruments including lens, fiber including fibers used to transmit data, nanotechnology machines, finely machined components including microscopic components, close tolerance machine parts, and micro-electro-mechanical systems structures, where smooth surfaces are desired on substrates containing features on the order of 0.1 nanometer to several micron size.

The present invention is particularly suitable for polishing/cleaning very high density semiconductor substrates, and is useful in various embodiments for all structures found thereon, including for example shallow trench isolation structures, LAN structures, silicon on insulator, deep gate structures, and the like. The term semiconductor as used herein means any devices including not only those formed over wafer of for example silicon, gallium arsenide (GaAS), silicon germanium (SiGe), GaAs on silicon substrate, or InP, but also those formed over a substrate such as TFT liquid crystal.

The compositions described herein are suitable for use on substrates that comprise, consist essentially of, or consist of any suitable metal, metal alloy, or metal compound such as nitride or carbides, metal composite, dielectrics, ferroelectric, organics, organometalics, or mixture thereof. The invention is particularly directed to methods of polishing structures on a substrate, the structures comprising iron, nickel, copper, tungsten, tantalum, aluminum, titanium, or alloys thereof, or compounds thereof, including nitrides and silicides, or any combination of the above. By way of example, the composition of the present invention may be used in the CMP of a substrate having one or more layers of aluminum, copper, copper aluminum alloy, nickel, nickel-phosphorus, nickel-iron, iron-phosphorus, Sendust, CZT, tantalum, titanium, tungsten, or alloys thereof, or metal compounds thereof such as tantalum nitride, titanium nitride, titanium tungsten, or combinations thereof.

The compositions described herein are suitable for use on substrates that comprise, consist essentially of, or consist of strained silicon, polysilicon, single-crystal silicon, polycrystalline silicon, amorphous silicon, or silicon-on-insulator, silicon nitride, gallium arsenide. nickel-phosphorus, alumino-borosilicate, tetraethoxysilane (TEOS), borosilicate glass, phosphosilicate glass (PSG), borophosphosilicate glass (BPSG), SOS (silicon on sapphire), silicon-germanium alloys, and silicon-germanium-carbon alloys.

The invention is not limited to semiconductor polishing; it also can be applied to glass substrates, including technical glass, optical glass, and ceramics, of various types known in the art. The term semiconductor as used herein means any devices including not only those formed over a silicon or gallium arsenide wafer but also those formed over a substrate such as TFT liquid crystal unless otherwise specifically indicated. Critical issues in generating high quality optical surfaces for silicate substrates, such as fused silica or silicate glasses, include the removal of surface and subsurface damage remnant from preliminary grinding processes, and the generation of relatively small topographical features with a surface roughness (Ra) typically below 5 angstroms.

The substrate can comprise, consist essentially of, or consist of any suitable metal oxide. Suitable metal oxides include, for example, alumina, silica, titania, ceria, zirconia, germania, magnesia, $Ta_2O_5$ and co-formed products thereof, and mixtures thereof, and combinations thereof. The composition can include TEOS, ferrodielectric material, and organic materials having a low dielectric constant ("low k"). The includes PZT ($PbZr_xTi_{1-x}O_3$), PLT, PLZT ($Pb_{1-y}La_yZr_xTi_{1-x}O_3$), SBT or BST ($Ba_xSr_{1-x}TiO_3$), where (0<x<1, 0<y<1), $PbTiO_3$, $SrTiO_3$, $SrBi_2Ta_2O_9$ and/or $BaTiO_3$, $Ta_2O_5$.

In selected preferred embodiments, the substrates comprise one or more of copper, tungsten, tantalum, polysilicon and/or titanium, or alloys of these metals, or compounds of these metals, or combinations thereof. In one embodiment there are metals/metal compounds comprising tungsten, tantalum, polysilicon and/or titanium layer form a barrier layer between a dielectric and a metal comprising copper. A barrier can be an adhesive film, for example, a TaN film, a WN film, a TiN film, or a layered film in which layers of Ti and TiN, Ta and TaN, or W and WN are present, or combinations of metals and metal nitrides, carbides, silicides, or the like.

Some embodiments of this invention are useful for polishing structures containing noble metals, for example one or more of ruthenium, iridium, platinum, gold, germanium, rhodium, palladium, and osmium.

OXIDIZERS: Often, CMP slurries incorporating ceria are substantially free of traditional oxidizers, particularly peroxides including hydrogen peroxide, hydrohydrogen peroxide, and urea hydrogen peroxide; persulfates including ammonium persulfates and dipersulfates; ferric salts; aluminum salts; periodic acid; periodates; and/or peracetic acid. As used herein, the term substantially free as it pertains to other oxidizers means less than about 0.1% by weight, for example less than about 0.01% by weight, and most preferably completely free of the component. These oxidizers generally have a high electrochemical potential, and will tend to oxidize various compounds on the substrate somewhat indiscriminately, and thereby negate the selective removal of particular components (and resultant high selectivity) possible when using the abrasive compounds of the present invention. However, in other embodiments the slurry can contain one or more of the above-listed traditional oxidizers. If present, these oxidizers should be used in an amount between about 0.01% and about 10% by weight, for example between about 0.01% and about 2% by weight, based on the weight of the fluid composition.

In another embodiment, the polishing composition or slurry is substantially free of hydroxylamines, or adducts, salts, or derivatives thereof.

However, in another preferred embodiment, the polishing composition or slurry comprises hydroxylamine or a derivative thereof. Salts of hydroxylamines include hydroxylamine nitrate, hydroxylamine sulfate, hydroxylamine phosphate, and the like. Adducts of hydroxylamine include the compound where each R of the $R_2N$—OR compound is independently hydrogen or a linear, branched, or cyclic hydrocarbon containing from 1 to 7 carbon atoms. Adducts of hydroxylamine can be present in salt form as well, e.g., as nitrates, sulfates, phosphates, or the like, or a combination thereof. The hydroxylamine electrochemical potential is variable depending on organic constituents, salts, and pH, and therefore depending on the composition can be within the same range as the electrochemical potential of the organosulfonic acids of the present invention. In such a composition, selectivity can be maintained, and conditions can be altered slightly to effect changes in the polishing selectivity between structures comprising different metals. If present, the hydroxylamine oxidizers should be used in an amount, based on the weight of the fluid composition, from about 0.001% to about 15% by weight, for example from about 0.1% to about 5% by weight, from about 0.01% to about 2% by weight, from about 0.001% to about 1% by weight, from about 0.001% to about 0.1% by weight, from about 0.01% to about 1% by weight, or from about 4% to about 10% by weight.

In another embodiment, the polishing composition or slurry is substantially free of dissolved cerium, aluminum, and/or iron-based oxidizers. In another embodiment the composition comprises between 20 and 10000 ppm of dissolved cerium, aluminum, and/or iron salts which function as oxidizers.

In another embodiment, the polishing composition or slurry is substantially free of benzene-sulfonic-based oxidizers. In another embodiment the composition comprises between 20 and 10000 ppm of benzene-sulfonic-based oxidizers. Preferred benzene-sulfonic-based oxidizers are those having a second sulfonate moiety or a nitro moiety in a meta position relative to the (first) sulfonate moiety on the ring structure, but embodiments having a polar moiety (e.g., an amino, nitro, sulfonate, carboxylate, or phosphonate moiety) in the ortho or meta positions relative to the sulfonate moiety on the ring are useful.

POLAR SOLVENT: The polishing compositions of the current invention can optionally comprise a polar organic solvent, though for most embodiments a preferred solvent is water. The water is advantageously purified, deionized, or otherwise treated so that the dissolved metals content prior to polishing is less than about 30 ppm, preferably less than about 3 ppm, and typically less than 1 ppm. In particular, in one embodiment the slurries of this invention are substantially free of divalent metals, e.g., less than 30 ppm of any such dissolved metal, and more particularly is substantially free, e.g., less than 10 ppm, for example less than 5 ppm, preferably less than 1 ppm, of dissolved transitional metals such as iron, aluminum, and/or cerium. The water is present in an amount above about 60%, for example in an amount greater than about 80%, by weight based on the weight of the fluid composition.

A preferred embodiment comprises ultrapure water or electrolyzed water as the only solvent, and is substantially free of polar organic solvents.

The composition can optionally contain one or more polar organic solvents, for example glycols, alkanolamines, sulfoxides such as DMSO, pyridienes including alkyl-substituted embodiments such as NMP, alcohols, or mixtures thereof, in a waterless composition or in combination with water.

Additives

Each additive described in the background section above can be used with the cerium-containing abrasives of this invention, including anionic polymers for example polyacrylic acid or ammonium polyacrylate; surfactants and/or a non-ionic polymer such as polyacrylamide or polyvinyl alcohol having a molecular weight of less than 10000 as described in U.S. Pat. No. 6,443,811; polyelectrolyte wherein the charge on the polyelectrolyte is different from the charge on the abrasive particles as described in U.S. Pat. No. 5,876,490; poly-vinyl sulfonic acid/or and potassium hydrogen phthalate as described in U.S. Pat. No. 6,540,935; saccarides including mannitol, sorbitol, mannose, xylitol, sorbose, sucrose, and dextrin as described in U.S. Pat. No. 6,616,514; polycarboxylate as described in U.S. Pat. No. 6,514,821; amino acids including for example proline, glycine, or alanine as described in U.S. Pat. No. 6,443,811; weakly adsorbed surfactant such as ammonium polyacrylate or an organic amine salt as described in U.S. Pat. No. 6,561,876, or any combination thereof, are useful additives in various embodiments of this invention. Additionally, the following is a list of additives that can optionally be included in any composition or slurry of the present invention, including Acids/Bases; Selectivity enhancers, Chelators; Corrosion Inhibitors; Surfactants; Rheological agents. However, embodiments that are substantially free of any one or any combination of these additives are also contemplated.

Acids/Bases—The polishing compositions of the current invention can comprise pH adjusting compounds. The pH of the solutions and slurries are beneficially adjusted with non-metal-containing acids and bases. Sulfates, as sulfuric acid or ammonium sulfate, are useful. Nitric acid and ammonium nitrate are also preferred. Other options include phosphoric acid, phophonic acids, sulfonic acids (including those with oxidizing potential), hydrochloric acid, organic acids, as well as substituted or unsubstituted ammonium and/or hydroxylamine compounds. Preferred pH adjustors are sulfuric acid, nitric acid, phosphoric acid, ammonium hydroxide, TMAH, ammonium nitrate, ammonium sulfate, or combinations thereof. The pH of CMP compositions is held within a range of from about 1 to about 11, but for worker safety the preferred pH is from about 2.5 to about 10, for example from about 3 to about 9. The pH of cleaners can be from about 1 to 12.

The preferred range for polishing polysilicon is about 1 to about 12, in some embodiments from about 4 to about 10, for example from about 4.8 to about 9.

The preferred range for polishing noble metals is about 1 to 12, for example from about 2 to about 9, in some embodiments from about 2 to about 5.

The particular pH can be selected by one of ordinary skill in the art without undue experimentation, with the benefit of this disclosure, for the particular materials on a given substrate and desired selectivity for each material. Of course, acids and bases can both be added to achieve a buffer to maintain a stable pH during polishing. Additionally, some acids, such as phosphoric acid, which can have a passivating effect can be present in amounts up to about 10% in the various compositions. On the other hand, acids comprising fluorine are generally used in amounts between 0.01% and 1% by weight.

Selectivity Enhancers—Various selectivity enhancers as are known in the art that are useful for ceria-based polishing compositions are useful in the methods of polishing claimed herein. It is recognized that various compounds useful as chelators, corrosion inhibitors, and rheological agents can also function in the category of selectivity enhancers.

Chelators—Any suitable complexing agent (e.g., chelating agent or selectivity enhancer) can be used in conjunction with the inventive method. Suitable complexing agents include, for example, carbonyl compounds (e.g., acetylacetonates), simple carboxylates (e.g., aryl carboxylates), carboxylates containing a hydroxyl groups (e.g., glycolates, lactates, gluconates, gallic acid), di-, tri-, and poly-carboxylates (e.g., oxalates, phthalates, citrates, succinates, tartrates, malates, edetates (e.g., EDTA), and carboxylates containing one or more sulfonic and/or phosphonic groups. Suitable chelating or complexing agents also can include, for example, di-, tri-, or poly-alcohols (e.g., ethylene glycol, pyrocatechol, pyrogallolp tannic acid, and the like) and phosphate-containing compounds, e.g., phosphonium salts, and phosphonic acids. Complexing agents also can include amine-containing compounds (e.g., amino acids, amino alcohols, di-, tri-, and poly-amines, and the like). Preferred chelators include for example EDTA, DPTA, multivalent organic acids including citric acid, oxalic acid, and/or gallic acid, polyhydroxyaromatics including catechols, and/or organosulfamic acid compounds.

If present, chelators are beneficially present in an amount be present in an amount between about 0.01% and about 12% by weight, for example between about 0.5% and about 6%, based on the weight of the fluid composition. Some chelators, especially at higher concentrations, act as corrosion inhibitors.

Corrosion Inhibitors—Any suitable film-forming agent (e.g., corrosion-inhibitor) can be used in conjunction with the inventive method. For example, suitable film-forming agents generally include surface-active agents that preferentially adsorb to selected portions of the substrate. Therefore, suitable film-forming agents include, for example, amine-containing compounds such as primary, secondary, tertiary, and quaternary amines and amino acids, alkylamines, alkanolamines, hydroxylamines, phosphate esters, sodium laurylsulfate, fatty acids, polyacrylates, polymethacrylates, polyvinylphosphonates, polymalate, polystyrenesulfonate, and polyvinylsulfonate. Other suitable film-forming agents include, for example, benzotriazole, triazole, benzimidazole, and mixtures thereof.

If present, corrosion inhibitors are beneficially present in an amount between about 0.01% and about 5% by weight, based on the weight of the fluid composition.

Surfactants—If a surfactant is added to the first CMP slurry, then it may be an anionic, cationic, nonionic, or amphoteric surfactant or a combination of two or more surfactants can be employed. Furthermore, it has been found that the addition of a surfactant may be useful to reduce the within-wafer-non-uniformity (WIWNU) of the wafers, thereby improving the surface of the wafer and reducing wafer defects. While there are many suitable surfactant additives for the composition, preferred surfactant additives include dodecyl sulfate sodium salt, sodium lauryl sulfate, dodecyl sulfate ammonium salt, and any combination thereof. Suitable commercially available surfactants include TRITON DF 16™ manufactured by Union Carbide and SUIRFYNOL™ manufactured by Air Products and Chemicals.

Various anionic and cationic surfactants having molecular weight in the range from less than about 1000 Daltons to greater than about 30,000 Daltons are contemplated as dispersants. Included are sodium, potassium, or preferably ammonia salts of stearate, lauryl sulfate, alkyl polyphosphate, dodecyl benzene sulfonate, disopropylnaphthalene sulfonate, dioctylsulfosuccinate, ethoxylated and sulfated lauryl alcohol, and ethoxylated and sulfated alkyl phenol.

Various cationic surfactants include polyethyleneimine, ethoxylated fatty amine and stearylbenzyldimethylammonium chloride or nitrate. Alternate dispersants contemplated in the present invention include: polyethylene glycols, lecithin, polyvinyl pyrrolidone, polyoxyethylene, isoctylphenyl ether, polyoxyethylene nonylphenyl ether, amine salts of alkylaryl sulfonates, polyacrylate and related salts, polymethacrylate.

If present, surfactants are beneficially present in an amount between about 0.01% and about 3% by weight, based on the weight of the fluid composition.

Rheological agents—Any suitable rheological control agent can be used in conjunction with the inventive method, including viscosity enhancing agents and coagulants. Suitable rheological control agents include, for example, polymeric rheological control agents. Moreover, suitable rheological control agents include, for example, urethane polymers (e.g., urethane polymers with a molecular weight greater than about 100,000 Daltons), acrylates comprising one or more acrylic subunits (e.g., vinyl acrylates and styrene acrylates), and polymers, copolymers, and oligomers thereof, and salts thereof. The rheological agents include for example polycarboxylic acids, polyolefins including polystyrene, ethoxy-block copolymers, polymeric surfactants, polyalkyleneimines, and the like. Molecular weights of rheological aids vary, but are typically between 2000 Daltons and 1,500,000 Daltons, generally 5000 to 500,000 Daltons.

If present, rheological agents are beneficially present in an amount from about 0.01% to 2% by weight, based on the weight of the fluid composition.

Other Abrasives

The CMP composition typically comprises an abrasive, though in some embodiments an abrasive pad is used, and the CMP composition can be substantially free of abrasives. The use of cerium-containing abrasive has been previously discussed. While preferred embodiments use only abrasive particles that comprise cerium, in other embodimments other abrasives can also be used in a slurry of this invention. The amount of other abrasive can be from about 0.01% to about 30% by weight, for example between about 1% and about 15% by weight, based on the weight of the fluid composition.

Examples of suitable abrasive particles include, but are not limited to, metal oxides including alumina, silica, titania ($TiO_2$), $Ti_2O_3$, particles with mixed titanium oxides, zirconia, manganese dioxide, yttrium oxide ($Y_2O_3$) particles, $Fe_2O_3$ particles; FeO particles, tin oxide, germania, zirconia, copper oxide, nickel oxide, tungsten oxide, ceria (without a mixed phase) as well as spinels comprising one or more of Al, Mg, Zn, and Fe; and abrasive compounds other than oxides, for example metal (of the metals listed in the preceding oxides) nitrides such as zirconium nitride, metal (of the metals listed in the preceding oxides) carbides, e.g., silicon carbide, titanium carbide, or tungsten carbide; metal (of the metals listed in the preceding oxides) silicides; or ceramics such as metal (of the metals listed in the preceding oxides) titanate, tantalate, zirconate, metal-germanium oxide, niobate, boride, or combinations thereof; boron carbide; polycrystalline diamond; garnet; carborundum;), polymer/metal oxide composite, or mixtures of any of the above.

The preferred other abrasive is ceria without any mixed phase thereon.

Another other abrasive is a coated abrasive, that is, an abrasive comprising a first material partially or fully coating a second material, where at least one of the first material or second material is an abrasive as described herein. Examples include the alumina-coated silica used in an example described infra.

By way of example, the alumina may be an alpha-alumina, a gamma-alumina, colloidal alumina, fused alumina, ceramic alumina, or other aluminas known in the art, or a combination thereof. The silica can be colloidal, fumed, or any other type known in the art, or combinations thereof. The ceria can be colloidal, fumed, or any other type known in the art, or combinations thereof.

An abrasive particle is a solid with a size between about 0.0005 microns and about 1 micron. In preferred preparations, the coated particles have an average particle size of less than about 0.2 microns (200 nm), preferably having an average particle size of about 0.1 microns or less, for example a composition where about 90% or more of the abrasive particles (by number) have a particle size less than about 30 nm. There is no particular minimum diameter. With very small, e.g., between about 0.001 micron and 0.01 micron particles are used, polishing rates are very slow, but finer patterns can be polished with fewer defects.

Method of Use

Chemical Mechanical Polishing—The general method of use is to provide the composition or slurry in an amount typically between about 20 ml/min to 250 ml/min to a volume between a substrate and a polishing pad, with a small amount of pressure such as between 2 and 12 psi, at a temperature between about ambient and about 70 C, where the pad is moved relative to the substrate, for example by rotating the pad and/or rotating a platen on which the substrate is mounted, for example between about 10 and about 200 rpm for either or both. Use of the compositions and processes of the present invention may reduce, minimize or eliminate imperfections, defects, corrosion, recession and/or erosion that might otherwise appear on the substrate surfaces.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed:

1. A method of chemically mechanically polishing a substrate which comprises a dielectric material and a material comprising a metal, comprising the steps of:
    A) providing a polishing slurry comprising:
        1) a synthetic abrasive material comprising at least one of particles comprising $CeO_2$ and particles comprising $Ce_2O_3$, particles comprising $CeO_2$ and particles comprising cerium nitride, particles comprising $CeO_2$ and particles comprising cerium oxynitride, particles comprising $CeO_2$ and particles comprising cerium fluoride, or particles comprising $CeO_2$ and particles comprising ceric sulfide, and
        2) a solvent comprising water, a polar organic solvent, a non-polar organic solvent, or mixture thereof, and
    B) providing a substrate having a surface comprising a dielectric material and a material comprising a metal; and
    C) movably contacting the polishing slurry with the surface under conditions where a portion of the substrate is removed by a chemical mechanical polishing process.

2. The method of claim 1 wherein the slurry further comprises a polishing accelerator, a selectivity enhancer, or both.

3. The method of claim 1 wherein the abrasive comprises particles comprising $CeO_2$ and particles comprising $Ce_2O_3$.

4. The method of claim 1 wherein the abrasive comprises particles comprising $CeO_2$ and particles comprising cerium nitride, cerium oxynitride, or both.

5. The method of claim 1 wherein the abrasive comprises particles comprising $CeO_2$ and particles comprising ceric fluoride.

6. The method of claim 1 wherein the abrasive comprises particles comprising $CeO_2$ and particles comprising ceric sulfide.

7. A method of chemically mechanically polishing a substrate which comprises a dielectric material and a material comprising a metal, comprising the steps of:
    A) providing a polishing slurry comprising:
        1) a synthetic abrasive material comprising any of particles comprising $Ce_2O_3$ and particles comprising cerium nitride and/or cerium oxynitride, particles comprising $Ce_2O_3$ and particles comprising cerium fluoride, or particles comprising $Ce_2O_3$ and particles comprising cerium sulfide, and 2) a solvent comprising water, a polar organic solvent, a non-polar organic solvent, or mixture thereof, and B) providing a substrate having a surface comprising a dielectric material and a material comprising a metal; and:

C) movably contacting the polishing slurry with the surface under conditions where a portion of the substrate is removed by a chemical mechanical polishing process.

8. The method of claim 7 wherein the slurry further comprises a polishing accelerator, a selectivity enhancer, or both.

9. The method of claim 7 wherein the abrasive comprises particles comprising $Ce_2O_3$ and particles comprising cerium nitride and/or cerium oxynitride.

10. The method of claim 7 wherein the abrasive comprises particles comprising $Ce_2O_3$ and particles comprising cerium fluoride.

11. The method of claim 7 wherein the abrasive comprises particles comprising $Ce_2O_3$ and particles comprising ceric sulfide.

12. A method of chemically mechanically polishing a substrate which comprises a dielectric material and a material comprising a metal, comprising the steps of:

A) providing a polishing slurry comprising:
1) a synthetic abrasive material comprising any of particles comprising both $CeO_2$ and $Ce_2O_3$ phases, particles comprising both $CeO_2$ and cerium nitride and/or cerium oxynitride phases, particles comprising both $CeO_2$ and ceric fluoride phases, or particles comprising both $CeO_2$ and ceric sulfide phases particles, and
2) a solvent comprising water, a polar organic solvent, a non-polar organic solvent, or mixture thereof, and B) providing a substrate having a surface comprising a dielectric material and a material comprising a metal; and C) movably contacting the polishing slurry with the surface under conditions where a portion of the substrate is removed by a chemical mechanical polishing process.

13. The method of claim 12 wherein the slurry further comprises a polishing accelerator, a selectivity enhancer, or both.

14. The method of claim 12 wherein the abrasive comprises particles comprising both $CeO_2$ and $Ce_2O_3$.

15. The method of claim 12 wherein the abrasive comprises particles comprising $CeO_2$ and at least one of cerium nitride or cerium oxynitride.

16. The method of claim 12 wherein the abrasive comprises particles comprising both $CeO_2$ and ceric fluoride phases.

17. The method of claim 12 wherein the abrasive comprises particles comprising both $CeO_2$ and ceric sulfide phases.

18. A method of chemically mechanically polishing a substrate which comprises a dielectric material and a material comprising a metal, comprising the steps of:

A) providing a polishing slurry comprising: a synthetic particle comprising a plurality of cerium materials selected from $CeO_2$, $Ce_2O_3$, cerium nitride, cerium oxynitride, cerium fluoride, and cerium sulfide materials, and a solvent comprising water, a polar organic solvent, a non-polar organic solvent, or mixture thereof, and B) providing a substrate having a surface comprising a dielectric material and a material comprising a metal; and C) movably contacting the polishing slurry with the surface under conditions where a portion of the substrate is removed by a chemical mechanical polishing process, wherein the abrasive particle comprises two of $CeO_2$, $Ce_2O_3$, ceric nitride, ceric fluoride, and ceric sulfide phases, wherein both of the chases are present in an amount each greater than about 0.1% by weight of the particle.

19. The method of claim 18 wherein the slurry further comprises a polishing accelerator, a selectivity enhancer, or both.

20. The method of claim 18 wherein the abrasive particle comprises two of $CeO_2$, $Ce_2O_3$, cerium nitride, cerium fluoride, or cerium sulfide materials, wherein both of the included cerium materials are present in the abrasive particle in an amount each greater than about 1% by weight of the particle.

* * * * *